United States Patent
Shen et al.

(10) Patent No.: US 10,008,267 B2
(45) Date of Patent: Jun. 26, 2018

(54) METHOD FOR OPERATING FLASH MEMORY

(71) Applicant: Integrated Silicon Solution (Shanghai), Inc., Shanghai (CN)

(72) Inventors: Anxing Shen, Shanghai (CN); Jianhui Xie, Shanghai (CN); Chih-Kuang Lin, Shanghai (CN)

(73) Assignee: Integrated Silicon Solution (Shanghai), Inc., Shanghai (CN)

(*) Notice: Subject to any disclaimer, the term of this patent is extended or adjusted under 35 U.S.C. 154(b) by 0 days. days.

(21) Appl. No.: 15/657,207

(22) Filed: Jul. 24, 2017

(65) Prior Publication Data

US 2018/0040375 A1 Feb. 8, 2018

(30) Foreign Application Priority Data

Aug. 4, 2016 (CN) .......................... 2016 1 0634627

(51) Int. Cl.
| | |
|---|---|
| *G11C 16/04* | (2006.01) |
| *G11C 16/34* | (2006.01) |
| *G11C 16/10* | (2006.01) |
| *G11C 16/26* | (2006.01) |
| *G11C 7/12* | (2006.01) |

(52) U.S. Cl.
CPC ............ *G11C 16/0425* (2013.01); *G11C 7/12* (2013.01); *G11C 16/0466* (2013.01); *G11C 16/0483* (2013.01); *G11C 16/10* (2013.01); *G11C 16/26* (2013.01); *G11C 16/34* (2013.01)

(58) Field of Classification Search
CPC ............ G11C 16/0483; G11C 11/5621; G11C 16/0425; G11C 11/5642; G11C 16/3495; G11C 16/10; G11C 16/26; G11C 16/0466; G11C 16/34; G11C 7/12
USPC ............. 365/185.05, 185.17, 185.18, 185.33
See application file for complete search history.

(56) References Cited

U.S. PATENT DOCUMENTS

| | | | |
|---|---|---|---|
| 5,095,344 A * | 3/1992 | Harari ................ | G11C 11/5621 257/327 |
| 6,849,895 B2 * | 2/2005 | Osabe ................... | B82Y 10/00 257/311 |
| 2003/0218920 A1 * | 11/2003 | Harari ................ | G11C 11/5621 365/200 |

* cited by examiner

*Primary Examiner* — Gene Auduong
(74) *Attorney, Agent, or Firm* — Jun He Law Offices P.C.; James J. Zhu (57) ABSTRACT

The present disclosure relates to semiconductor devices and discloses a method for operating a flash memory. When a read operation is performed on a flash memory unit, a potential of a first control line connected to gates of select gate PMOS transistors located in a same row is switched from a positive supply voltage to 0V. Since it is not required to switch the potential from a positive voltage to a negative voltage, the power consumption of the pump circuit is significantly reduced. In addition, a read current of the flash memory unit selected for reading can accurately represent the status of the unit being read thanks to the appropriate settings of the gate oxide layer thickness and the threshold voltage of the select gate PMOS transistor. Furthermore, high-voltage devices are removed from the read path and only low-voltage devices are used, so that the reading speed can be significantly improved during the read operation.

10 Claims, 6 Drawing Sheets

METHOD FOR OPERATING FLASH MEMORY

CROSS-REFERENCE TO RELATED APPLICATIONS

This application claims priority to Chinese patent application No. 201610634627.1 filed on Aug. 4, 2016, the entire content of which is incorporated herein by reference.

TECHNICAL FIELD

The present disclosure relates to semiconductor devices, and more particularly, to a method for operating a flash memory.

BACKGROUND

Embedded 2T_pFlash memories are usually integrated into a system-on-chip, such as a subscriber identity module (SIM) card chip of a mobile phone or a smart bankcard chip, in form of an intellectual property (IP). Because of this feature, they are called "embedded" to distinguish from products of stand-along flash memories.

A single memory unit is formed by connecting two P-type metal-oxide-semiconductor (MOS) field transistors (a select gate transistor and a control gate transistor) in series, so it is called 2T_pFlash. The PMOS transistor is an elementary device for the modern very large scale integrated circuit. The PMOS transistor has four control terminals including a gate terminal, a drain terminal, a source terminal and a bulk terminal. The transistor can be turned on or off (corresponding to current on or off) by controlling the voltages applied to the four terminals. The select gate transistor is typically connected in series with the control gate transistor to form a "2T flash memory unit". A flash memory unit with a specific address can be selected or deselected to operate through the select gate transistor. The control gate transistor is a unit storing "0/1" in the common sense. Specific operations are performed to make the transistor to present different electric characteristics (e.g., different threshold voltages), so as to represent "0" or "1". The floating gate is usually embedded between the control gate and the silicon substrate of the control gate transistor to form a sandwich structure. The floating gate and the control gate are insulated by an oxide-nitride-oxide insulating film disposed therebetween, and the floating gate and the silicon substrate are insulated by an oxide insulating film. The floating gate itself is usually N-type or P-type doped polysilicon, which can be used to store charges to change the electric characteristics of the control gate PMOS transistor.

Figure 1:
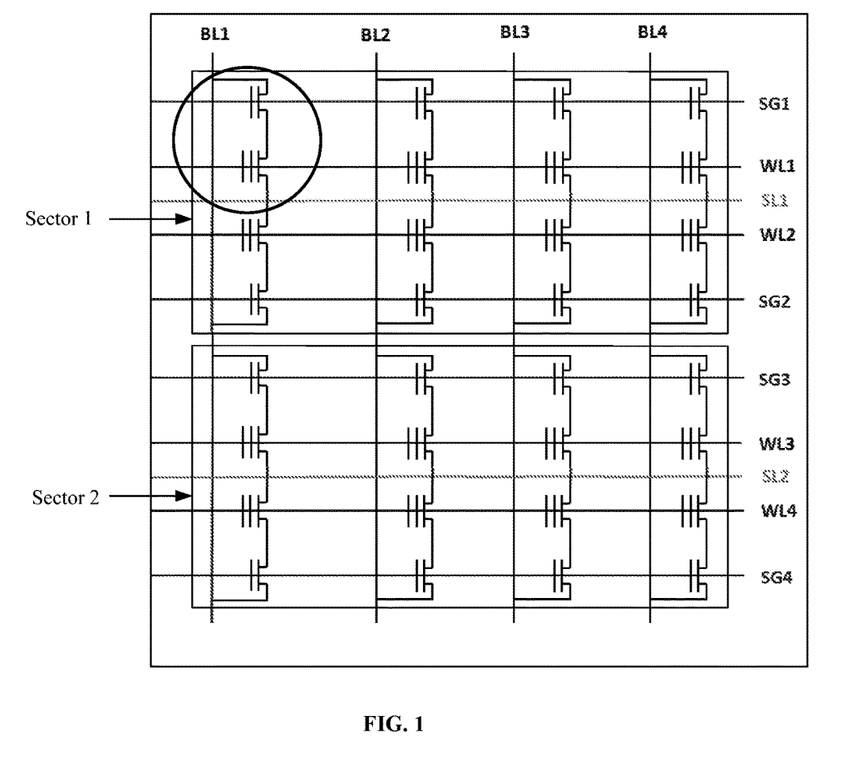
FIG. 1 is a diagram of a flash memory array according to an embodiment of the present disclosure.

The embedded 2T pMOS flash memory array uses a NOR structure (as shown in FIG. 1), so as to ensure random access. A bit line (which is usually referred to as "BL" for short) in FIG. 1 is used to control a voltage of a drain of a transistor. A word line (which is usually referred to as "WL" for short) is used to control a voltage of a gate of the transistor. A source line (which is usually referred to as "SL" for short) is used to control a voltage of a source of the transistor. In the NOR structure, any one of the flash memory units can be read by applied different bias voltages to the BL/WL/SL lines. Taking the memory unit marked by a circuit shown in FIG. 1 as an example, the line SG-1 is used to turn on the select gate PMOS transistor, a suitable gate voltage is applied to the control gate PMOS transistor through the WL-1, and then "0"/"1" is determined based on whether there is a current between the BL-1 and the SL-1 during a read operation.

The conventional 2T_pFlash device structure and array structure can achieve a minimum power of 150 uA/Mhz and a minimum read time of 30 ns, which needs further improvement.

SUMMARY

A method for operating a flash memory is provided according to embodiments of the present disclosure. By using the method, the power consumption of the flash memory can be significantly reduced without affecting operations of flash memory units.

In an embodiment, a method for operating a flash memory array is provided, wherein the flash memory comprises an array having at least one sector each of which includes an N-type well and a plurality of flash memory units coupled in a matrix in the N-type well; each of the plurality of flash memory units comprising a select gate PMOS transistor and a control gate PMOS transistor, the control gate PMOS transistor being a PMOS transistor having a floating gate, and a first electrode of the select gate PMOS transistor being coupled to a second electrode of the control gate PMOS transistor; gates of the select gate PMOS transistors located in a same row of the matrix of the flash memory units being coupled together to form a first control line; and the select gate PMOS transistor having a threshold voltage of −0.5V to −0.6V, and a gate oxide layer with a thickness of 58 Å to 78 Å; wherein during a read operation, a potential of the first control line of a flash memory unit selected for reading is switched from a positive voltage to 0V; and wherein the first electrode is a source and the second electrode is a drain, or the first electrode is the drain and the second electrode is the source.

Compared with the conventional memory technology, embodiments of the present disclosure have the following advantages.

In embodiments of the present disclosure, during a read operation on a flash memory unit, a potential of the first control line connected to the gates of the select gate PMOS transistors of the same row is switched from the positive supply voltage to 0V. Since it is not required to switch the potential from a positive voltage to a negative voltage, the power consumption of the pump circuit is significantly reduced. Moreover, the read current of the flash memory unit selected for reading can accurately represent the status of the unit being read thanks to the appropriate settings of the gate oxide layer thickness and the threshold voltage of the select gate PMOS transistor.

Further, high-voltage devices are removed from the read path and only low-voltage devices are used, so that the reading speed can be significantly improved during the read operation.

Further, a shielding device is configured to be turned off during a write operation and an erase operation, so that the low voltage device in the read path can be protected from the high voltage.

DETAILED DESCRIPTION OF THE PREFERRED EMBODIMENTS

In the following description, numerous technical details are set forth in order to provide a better understanding of the present application. However, it will be understood by those of ordinary skill in the art that the technical solutions required by the claims of the present application may be practiced without these technical details and variations and modifications based on the following embodiments.

In order to clarify the objectives, characteristics and advantages of the present disclosure, the embodiments of the present disclosure will be described in detail with reference to the accompanying drawings.

Inventors of the present disclosure have found that, a main reason for large power consumption and slow speed of conventional memory technology is that a SG bias voltage in the X (WL) direction is switched from Vcc (positive supply voltage) to "−1V" during a read operation, which causes a very large power consumption of a pump circuit. Moreover, a high voltage device is used in a read operation SG path in the X (WL) direction, which causes a low read speed; and a high voltage device is also used in the Y (BL) direction during the read operation, which causes both a large power consumption and a slow read speed.

In view of the above reasons, the inventors of the present disclosure propose following solutions to address the problems of large power consumption and slow speed for the conventional memory technology. In embodiments of the present disclosure, a first control line is referred to as a select gate line (SG), and a second control line is referred to as a word line (WL), a third control line is referred to as a bit line (BL) and a fourth control line is referred to as a source line (SL), in order to be consistent with terminology commonly used in the art and to facilitate understanding of the present disclosure.

An embodiment of the present disclosure relates to a method for operating a flash memory. FIG. 1 is a schematic diagram of a flash memory array. As shown in FIG. 1, the flash memory array includes at least one sector (e.g., sector 1 and sector 2 shown in FIG. 1), and each sector includes an N-type well and a plurality of flash memory units coupled in a matrix in the N-type well. Each flash memory unit includes a select gate PMOS transistor and a control gate PMOS transistor. The control gate PMOS transistor is a PMOS transistor with a floating gate, and a first electrode of the select gate PMOS transistor is coupled to a second electrode of the control gate PMOS transistor.

In the matrix of the flash memory units, gates of the select gate PMOS transistors located in a same row are coupled together to form a first control line (e.g., SG1~4). During a read operation, a potential of the first control line of the flash memory unit selected for reading is switched from a positive voltage to 0V. A circuit simulation shows that such configuration can significantly reduce power consumption, i.e., a minimum power consumption can be reduced from 150 uA/Mhz (previous value) to <100 uA/Mhz.

Figure 2:
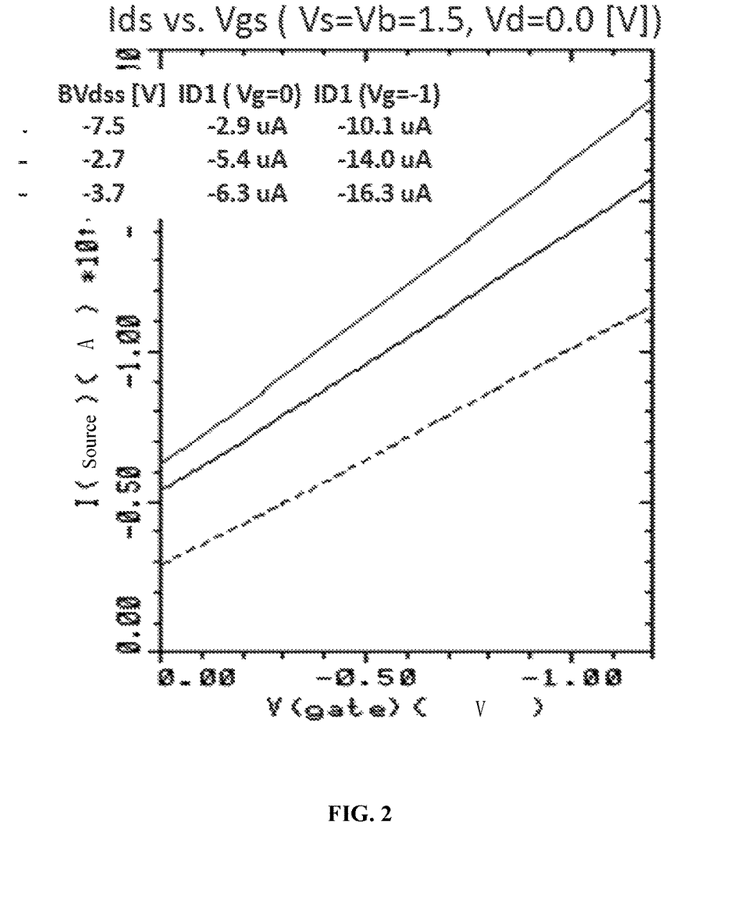
FIG. 2 illustrates a simulation result of a read current according to an embodiment of the present disclosure.

However, the inventors of the present disclosure have found that, after the potential of the first control line of the flash memory unit selected for reading is switched from the positive voltage to 0 V, no complete channel cannot be formed in the select gate PMOS transistor due to a decrease in the voltage differential, and thus a read current decreases and the read operation cannot performed normally. Thus, there is a need to adjust process parameters of the select gate PMOS transistor appropriately. In an embodiment of the present disclosure, for example, a threshold voltage of the select gate PMOS transistor is −0.55 V, and a thickness of the gate oxide layer of the select gate PMOS transistor is 68 Å. FIG. 2 shows a device simulation result of the improved read operation voltage bias and the optimized process parameters. As can be seen from FIG. 2, with the improvements of the optimized process parameter, the read current of the selected flash memory unit increases from 2.9 μA to 6.3 μA, which exceeds 5 μA that can accurately represent the state of the unit being read. In addition, it could be understood that, the threshold voltage of the select gate PMOS transistor may be set to −0.5 V~−0.6 V and the thickness of the gate oxide layer may be set to 58 Å~78 Å as long as the flash memory unit selected for reading can be normally read, and the present disclosure is not limited to the above parameters.

In an embodiment, the first electrode is a source and the second electrode is a drain. In another embodiment, the first electrode is the drain and the second electrode is the source.

In the present disclosure, when a read operation is performed on the flash memory unit, a potential of the first control line connected to the gates of the select gate PMOS transistors of the same row can be switched from the positive supply voltage to 0V. Since it is not necessary to switch the potential from a positive voltage to a negative voltage, the power consumption of the pump circuit is significantly reduced. Moreover, the read current of the flash memory unit selected for reading can accurately represent the status of the unit being read thanks to the appropriate settings of the gate oxide layer thickness and the threshold voltage of the select gate PMOS transistor.

In an alternative embodiment, a channel length of the select gate PMOS transistor is 100 nm-300 nm.; and for the control gate PMOS transistor, a thickness of the gate oxide layer is 8 nm-11 nm, a thickness of an oxide-nitride-oxide film insulating layer is 10 nm-20 nm, a thickness of the floating gate is 20 nm-100 nm, a doping concentration of the floating gate is greater than $1*10^{20}/cm^{-3}$, and a channel length is 100 nm-300 nm. Preferably, the channel length of the select gate PMOS transistor is 195 nm-300 nm; and for the control gate PMOS transistor, the thickness of the gate oxide layer is 10 nm-11 nm, the channel length is 165 nm-260 nm, the thickness of the oxide-nitride-oxide film insulating layer is 10 nm-20 nm, the dopant concentration of the floating gate is greater than $3*10^{20}/cm^{-3}$, and the thickness of the floating gate is 20 nm-100 nm.

Figure 3:
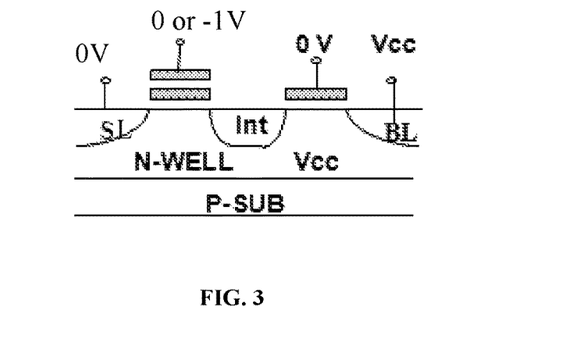
FIG. 3 is a diagram illustrating potential configurations for performing a read operation according to an embodiment of the present disclosure.

In the matrix of the flash memory units, gates of the control gate PMOS transistors located in the same row are coupled together to form a second control line (e.g., WL1~4), second electrodes of the select gate PMOS transistor located in the same column are coupled together to form a third control line (e.g., BL1~4), and first electrodes of the control gate PMOS transistors in each sector are coupled together to form a fourth control line (e.g., SL1-2). Alternatively, when the read operation is performed, a potential of the N-well of each sector is set to the power supply voltage (Vcc), a potential of the second control line of the flash memory unit selected for reading is set to −1V, a potential of the third control line is set to the power supply voltage, and a potential of the fourth control line is set to 0V. Alternatively, when the read operation is performed, the potential of the N-type well of each sector is set to the power supply voltage, the potential of the second control line of the flash memory unit selected for reading is set to 0V, the potential of the third control line is set to the power supply voltage (Vcc), and the potential of the fourth control line is set to 0V (as shown in FIG. 3). In the present embodiment, the power supply voltage Vcc is 1.5~1.8V.

It should be noted that, when the read operation is performed, the proper potential setting range and the optimized select gate transistor process parameters of the flash unit selected for reading is required to ensure that the flash memory can accurately perform the read operation while the power consumption can be reduced, and further required to be used in conjunction with other optimized potential data, such as the potentials of WL, BL and SL of the flash memory unit selected for reading and the potential setting to the deep N-wells (DWN) of each sector, in order to ensure that the read performance of the flash memory unit is optimal.

Another embodiment of the present invention relates to a method for operating a flash memory. This embodiment is further improved on the basis of the embodiments described above, with the main improvement that high-voltage device(s) is removed from the read path and only low-voltage device(s) is used, so that the reading speed can be significantly improved when the read operation is performed. A shielding device is further provided to be turned off during write and erase operations, which protects the low voltage device in the read path from the high voltage.

Figure 4:
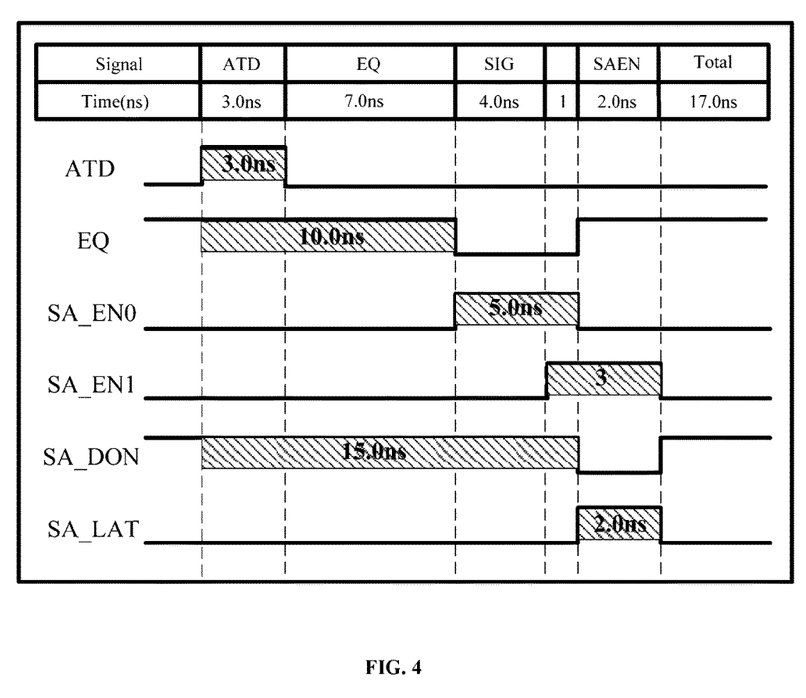
FIG. 4 illustrates a simulation result of a read time according to another embodiment of the present disclosure.

Specifically, when the read operation is performed, all devices in the read path are core devices. For example, high voltage devices are removed from the SG path in the X (WL) direction during the read operation and only low voltage devices are used, and/or the high voltage devices are also removed in the Y (BL) direction during the read operation and only the low voltage devices are used. A circuit simulation result in FIG. 4 shows that the improved read time can be less than 20 ns. It will be appreciated that, the read path is a path through which the read current flows when the read operation is performed and the core device is the logic device with the lowest operating voltage.

Figure 5:
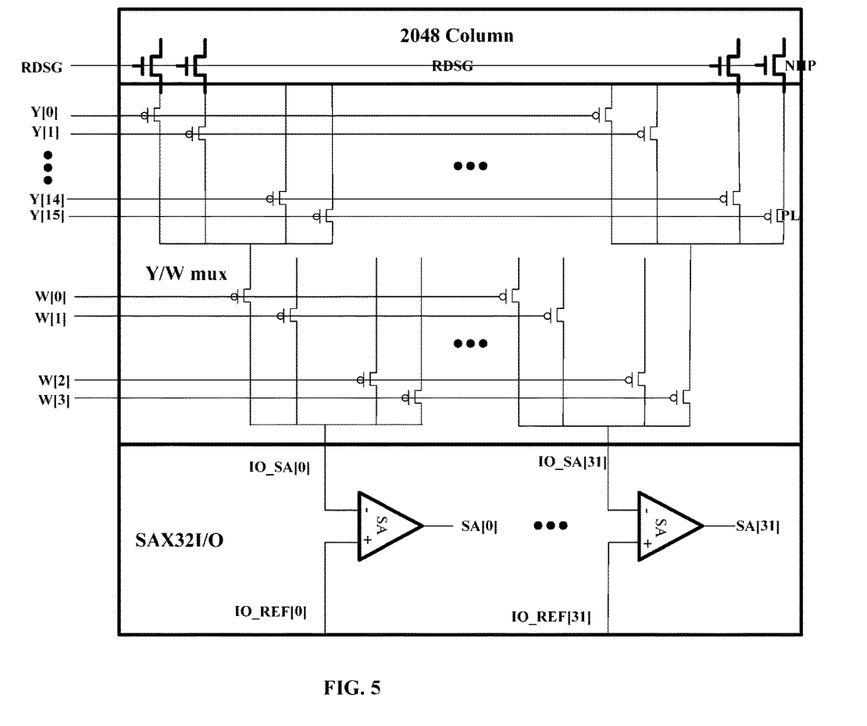
FIG. 5 is a diagram of a column selection device used for reading according to another embodiment of the present disclosure.

Optionally, the flash memory array further includes a shielding device. The shielding device is configured to be turned off during a write operation and an erase operation, so that no current flows through the core device in the read path. For example, as shown in FIG. 5, a RDSG device (i.e., the shielding device) is added in the Y (BL) direction and is turned off during the write and erase operations to isolate the low voltage device above the RDSG device from the high voltage device under the RDSG device, so as to achieve a purpose of protecting the low voltage device circuit in the read operation Y (BL) direction.

Figure 6:
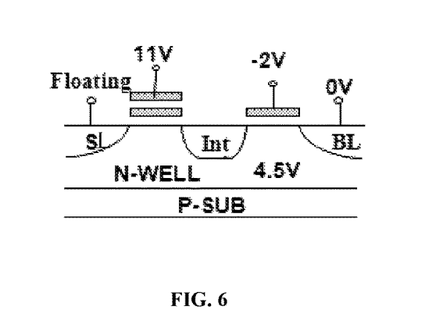
FIG. 6 is a diagram illustrating potential configurations for performing a write operation according to another embodiment of the present disclosure.

In an alternative embodiment, a write operation method using a backbias assisted band to band tunneling effect can be used, as shown in FIG. 6. Specifically, in the matrix of the flash memory units, the gates of the select gate PMOS transistors located in the same row are coupled together to form the first control line, the gates of the control gate PMOS transistors located in the same row are coupled together to form the second control line, the second electrodes of the select gate PMOS transistors located in the same column are coupled together to form the third control line, and the first electrodes of the control gate PMOS transistors in each sector are coupled together to form the fourth control line. When the write operation is performed, the potential of the N-type well of each sector is set to 4.5 V, the potential of the first control line of the flash memory unit selected for writing/programming is set to −2V, the potential of the second control line is set to 11 V, the potential of the third control line is set to 0V, and the fourth control line is set to a floating state. It could be understood that, in other embodiments of the present disclosure, other write operation methods may be used. For example, when the write operation is performed, the potential of the N-type well of each sector is set to 1.8 V, the potential of the first control line of the flash memory unit selected for writing/programming is set to −5.5V, the potential of the second control line is set to 10.6 V, the potential of the third control line is set to −3.5 V, the fourth control line is set to 0.9 V, and so on, and the present disclosure is not limited to the above configurations.

In order to form a flash memory array having a regular arrangement, process steps for manufacturing an embedded 2T pMOS flash memory are described as follows.

1. Forming an active area. This step are employed mainly to form areas for making flash memory units on a monocrystalline silicon wafer, and to isolate various areas by shallow trench isolation (STI) process effectively. It will be appreciated that, in other embodiments of the present disclosure, other dielectric isolation processes, such as an isoplanar process or a local oxidation process, may be employed to isolate different areas.

2. Forming a deep N-well. As flash memory units of the embedded 2T pMOS flash memory are PMOS devices and the monocrystalline silicon wafer is usually p-type doped, this step is employed to form deep N-wells and dispose all flash memory unit devices in surrounding deep N-wells. It will be appreciated that, in other embodiments of the present disclosure, an n-type doped monocrystalline silicon wafer may be used to form the devices.

Figure 7A:
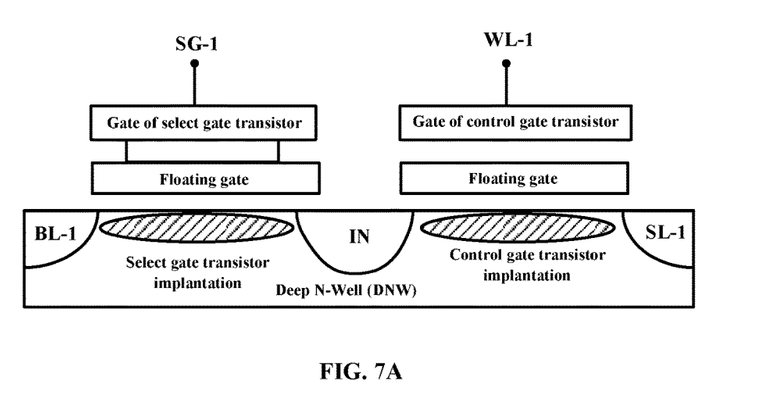
FIGS. 7A-7D are diagrams illustrating process steps for manufacturing a flash memory unit according to an embodiment of the present disclosure.

3. Performing threshold implantation of the select gate PMOS transistor. As it is desired to obtain a read current as big as possible in a read state, the select gate transistor coupled to the control gate transistor usually should have a threshold much smaller than that of the control gate PMOS transistor. As shown in FIG. 7A, this step aims to implant n-type impurities into a channel area of the select gate transistor and activate the impurities, so as to control the value of the threshold of the select gate transistor. Generally, a range of threshold value of the select gate PMOS transistor is controlled to be from −0.5V to −1.5V. It should be noted that, the threshold implantation of the select gate PMOS transistor may simultaneously enter into channel areas of the select gate transistor and the control gate transistor.

Figure 7B:
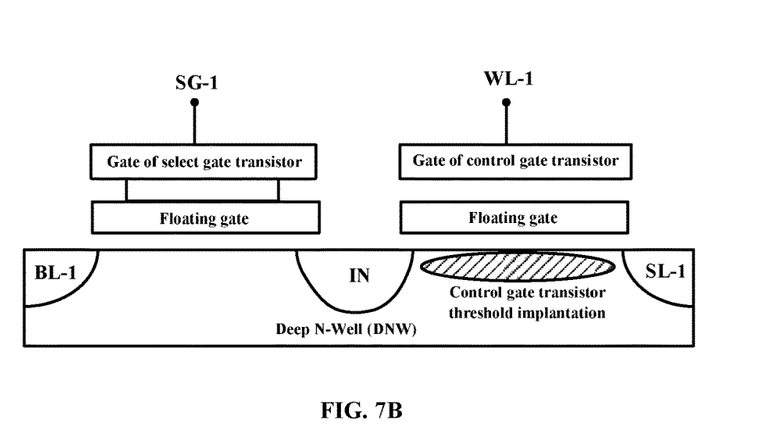

4. Performing threshold implantation of the control gate PMOS transistor. In order to prevent the occurrence of a punch-through effect of the control gate transistor in a programming state (IN coupled to high potential and SL-1 coupled to low potential), the threshold of the control gate transistor is usually higher than that of the select gate transistor, and should be precisely controlled. As shown in FIG. 7B, this step aims to implant n-type impurities into a channel area of the control gate transistor and activate the impurities, so as to control the value of the threshold of the control gate transistor. Generally, a threshold value range of the control gate PMOS transistor is controlled to be from −1.8V to −2.8V. As described in step 3, because the two processes of "threshold implantation of the select gate PMOS transistor" and "threshold implantation of the control gate PMOS transistor" are both performed on the channel area of the control gate transistor, the threshold of the control gate transistor is higher.

5. Forming a tunneling oxide layer. The tunneling oxide layer also serves as a gate oxide of the select gate transistor and the control gate transistor, and is typically formed by a "dry-oxygen thermal growth" process to ensure the quality of the oxide layer.

6. Forming an n-type polysilicon floating gate. This step mainly deposits and forms polysilicon on active areas of the flash memory array, and forms n-type heavily doped polysilicon floating gates by n-type ion implantation and activation.

7. Forming an ONO insulating layer and etching a portion of the ONO insulating layer. The ONO insulating layer includes three film layers, i.e. oxide, nitride and oxide layers from bottom to top. After this step, the ONO insulating layer and the tunneling oxide layer in the control gate transistor region will together isolate the floating gate from exterior regions, so as to ensure that electrons injected into the floating gate in a write/programing process can be stored for a long time. In the select gate transistor region, the ONO insulating layer may be removed by lithography and etching processes, to ensure that subsequent gate polysilicon is fully in contact with the floating gate polysilicon (i.e., the floating gate has a same functionality as the gate of the select gate transistor), and the completed select gate transistor can be considered as a normal single-gate PMOS transistor.

8. Forming gate polysilicon. This step first deposits a polysilicon film. Since both the select gate transistor and the control gate transistor are PMOS transistors, p-type ions are then implanted into the polysilicon film and activated to form p-type heavily doping. Finally, gates of the select gate transistor and the control gate transistor are formed by exposure and etching processes. Accordingly, the gate and the floating gate of the select gate transistor are an integral structure, while the gate and the floating gate of the control gate transistor are isolated by the ONO insulating layer.

9. Performing internal-node junction ion implantation. This step forms an IN junction by p-type ion implantation and activation. Since the 2T pMOS flash memory uses the band-to-band tunneling hot-electron injection (BBHE) effect to inject electrons from a node of the IN to the floating gate for writing/programming, there is specific requirement on the doping concentration and depth of the IN, and such process cannot be replaced by conventional P+ source/drain implantation.

Figure 7C:
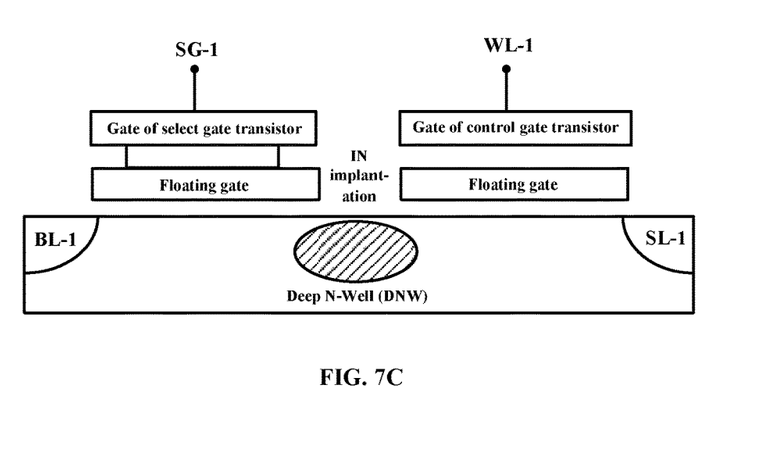
Figure 7D:
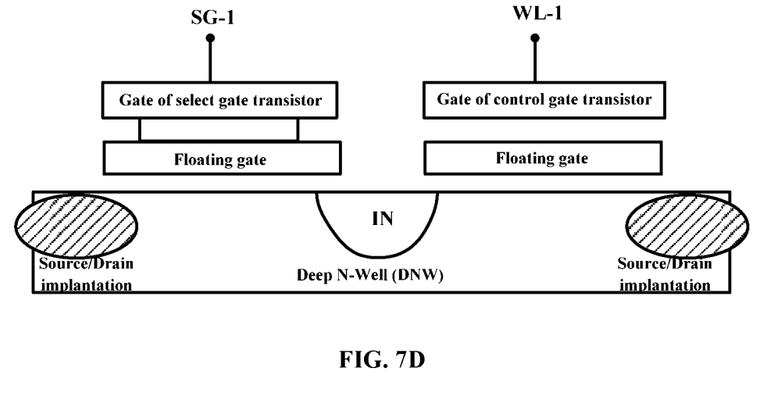

10. P+ source and drain implantation. As shown in FIG. 7D, this step mainly forms source and drain doping of the pMOS. The 2T pMOS flash memory device includes the two nodes labelled as BL-1 and SL-1 as shown in FIG. 7C.

11. Performing other back-end processes, such as forming contact through-holes, metal wires or passivation layers.

The method according to various embodiments of the present disclosure may be implemented by software, hardware, firmware or the like. No matter whether the method is implemented by software, hardware or firmware, instruction codes may be stored in any type of computer-accessible memory (e.g., permanent or modifiable, volatile or nonvolatile, solid or non-solid, fixed or replaceable media, etc.). Similarly, the memory may be, for example, a programmable array logic (PAL), a random access memory (RAM), a programmable read only memory (PROM), a read-only memory (ROM), an electrically erasable programmable ROM (EEPROM), a magnetic disk, an optical disk, a digital versatile disc (DVD) and so on.

In summary, the operating voltage, device performance and design of the embedded 2T_pFlash flash memory device are optimized according to the embodiments of the present disclosure, such that the power consumption may be reduced from 150 uA/Mhz to 100 uA/Mhz and the read time may be reduced from 30 ns to <20 ns.

It should be noted that, in the claims and the specification of the present disclosure, relational terms such as "first" and "second" are used only to distinguish an entity or an operation from another entity or operation without requiring or suggesting that there is any such actual relationship or sequence between these entities or operations. Moreover, the term "comprising", "including" or any other variant thereof is intended to encompass a non-exclusive inclusion such that processes, methods, articles, or devices that include a series of elements include not only those elements but also those that are not explicitly listed, or other elements that are inherent to such processes, methods, articles, or devices. In the absence of more restrictions, the elements that are limited by the statement "including one" do not exclude the presence of additional elements in the process, method, article, or device that includes the elements.

While the invention has been illustrated and described with reference to certain preferred embodiments of the invention, it will be understood by those of ordinary skill in the art that various changes may be made in form and detail without departing from the spirit and scope of the invention.

What is claimed is:

1. A method for operating a flash memory, wherein the flash memory comprises an array having at least one sector each of which comprises an N-type well and a plurality of flash memory units coupled in a matrix in the N-type well;
   each of the plurality of flash memory units comprising a select gate PMOS transistor and a control gate PMOS transistor, the control gate PMOS transistor being a PMOS transistor having a floating gate, and a first electrode of the select gate PMOS transistor being coupled to a second electrode of the control gate PMOS transistor;
   gates of the select gate PMOS transistors located in a same row of the matrix of the flash memory units being coupled together to form a first control line; and
   the select gate PMOS transistor having a threshold voltage of −0.5V to −0.6V, and a gate oxide layer with a thickness of 58 Å to 78 Å,
   the method comprising:
   switching a potential of the first control line of a flash memory unit selected for reading from a positive voltage to 0V during a read operation,
   wherein the first electrode is a source and the second electrode is a drain, or the first electrode is the drain and the second electrode is the source.

2. The method of claim 1, wherein a channel length of the select gate PMOS transistor is 100 nm-300 nm.

3. The method of claim 1, wherein the control gate PMOS transistor has a gate oxide layer with a thickness of 8 nm-11 nm, an oxide-nitride-oxide film insulating layer with a thickness of 10 nm-20 nm, a channel length of 100 nm-300 nm, and wherein the floating gate of the control gate PMOS transistor has a thickness of 20 nm-100 nm and a doping concentration greater than $1*10^{20}/cm^{-3}$.

4. The method of claim 1, wherein in the matrix of the flash memory units, gates of the control gate PMOS transistors located in a same row are coupled together to form a second control line, second electrodes of the select gate PMOS transistors located in a same column are coupled together to form a third control line, and first electrodes of the control gate PMOS transistors in each sector are coupled together to form a fourth control line; and during the read operation, a potential of the N-type well of each sector is set to a power supply voltage, a potential of the second control line of the flash memory unit selected for reading is set to −1V, a potential of the third control line is set to the power supply voltage, and a potential of the fourth control line is set to 0V.

5. The method of claim 1, wherein, in the matrix of the flash memory units, gates of the control gate PMOS transistors located in a same row are coupled together to form a second control line, second electrodes of the select gate PMOS transistors located in a same column are coupled together to form a third control line, and first electrodes of the control gate PMOS transistors in each sector are coupled together to form a fourth control line; and during the read operation, a potential of the N-type well of each sector is set to a power supply voltage, a potential of the second control line of the flash memory unit selected for reading is set to 0V, a potential of the third control line is set to the power supply voltage, and a potential of the fourth control line is set to 0V.

6. The method of claim 1, wherein, during the read operation, all devices in a read path are core devices.

7. The method of claim 6, wherein the flash memory array further comprises a shielding device, and the shielding device is configured to be turned off during a write operation and an erase operation, so that no current flows through the core devices on the read path.

8. The method of claim 1, wherein, in the matrix of the flash memory units, gates of the select gate PMOS transistors located in a same row are coupled together to form the first control line, gates of the control gate PMOS transistors located in a same row are coupled together to form a second control line, second electrodes of the select gate PMOS transistors located in a same column are coupled together to form a third control line, and first electrodes of the control gate PMOS transistors in each sector are coupled together to form a fourth control line; and during a write operation, a potential of the N-type well of each sector is set to 4.5 V, a potential of the first control line of the flash memory unit selected for writing is set to −2V, a potential of the second control line is set to 11 V, a potential of the third control line is set to 0V, and the fourth control line is set to a floating state.

9. The method of claim 1, wherein the select gate PMOS transistor has a channel length of 195 nm-300 nm; and wherein the control gate PMOS transistor has a gate oxide layer with a thickness of 10 nm-11 nm, a channel length of 165 nm-260 nm, an oxide-nitride-oxide film insulating layer with a thickness of 10 nm-20 nm, and the floating gate of the control gate PMOS transistor has a dopant concentration greater than $3*10^{20}/cm^{-3}$, and a thickness of 20 nm-100 nm.

10. The method of claim 1, wherein the threshold voltage of the select gate PMOS transistor is −0.55V, and the thickness of the gate oxide layer of the select gate PMOS transistor is 68 Å.

* * * * *